United States Patent
Grumbine et al.

(10) Patent No.: US 7,776,230 B2
(45) Date of Patent: Aug. 17, 2010

(54) CMP SYSTEM UTILIZING HALOGEN ADDUCT

(75) Inventors: Steven Grumbine, Aurora, IL (US); Francesco De Rege Thesauro, Naperville, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 687 days.

(21) Appl. No.: 11/673,518

(22) Filed: Feb. 9, 2007

(65) Prior Publication Data

US 2008/0057715 A1 Mar. 6, 2008

Related U.S. Application Data

(60) Provisional application No. 60/841,005, filed on Aug. 30, 2006.

(51) Int. Cl.
C03C 15/00 (2006.01)
(52) U.S. Cl. .......................... 216/88; 438/689; 438/691; 438/692; 216/34; 216/89; 252/79.1; 252/79.2; 252/79.3; 252/79.4
(58) Field of Classification Search ................. 438/689, 438/691, 692; 216/88, 34, 89; 252/79.1–79.4
See application file for complete search history.

(56) References Cited

U.S. PATENT DOCUMENTS

| | | | |
|---|---|---|---|
| 5,196,353 A | 3/1993 | Sandhu et al. | |
| 5,230,833 A | 7/1993 | Romberger et al. | |
| 5,433,651 A | 7/1995 | Lustig et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,527,622 B1 | 3/2003 | Brusic et al. | |
| 6,641,630 B1 | 11/2003 | Sun | |
| 6,821,309 B2 | 11/2004 | Singh et al. | |
| 6,976,905 B1 | 12/2005 | Fang et al. | |
| 7,097,541 B2 | 8/2006 | DeRege Thesauro et al. | |
| 7,148,189 B2 | 12/2006 | Singh | |
| 7,160,807 B2 | 1/2007 | De Rege Thesauro et al. | |
| 2004/0043702 A1 | 3/2004 | Singh | |
| 2006/0030158 A1 | 2/2006 | Carter et al. | |
| 2007/0219104 A1* | 9/2007 | Grumbine et al. ........... 510/175 |
| 2007/0298612 A1* | 12/2007 | Dysard et al. ................ 438/689 |

* cited by examiner

*Primary Examiner*—Duy-Vu N. Deo
*Assistant Examiner*—Maki A Angadi
(74) *Attorney, Agent, or Firm*—Thomas E. Omholt; Ashlee B. Mehl; Steven D. Weseman

(57) ABSTRACT

The invention provides a chemical-mechanical polishing system for polishing a substrate comprising (a) a polishing component selected from an abrasive, a polishing pad, or both an abrasive and a polishing pad, (b) an aqueous carrier, and (c) the halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.01 mM or more in the aqueous carrier. The invention also provides a method of polishing a substrate comprising (i) providing the aforementioned chemical-mechanical polishing system, (ii) contacting the substrate with the polishing system, and (iii) abrading at least a portion of the surface of the substrate with the polishing system to polish the substrate.

16 Claims, 1 Drawing Sheet

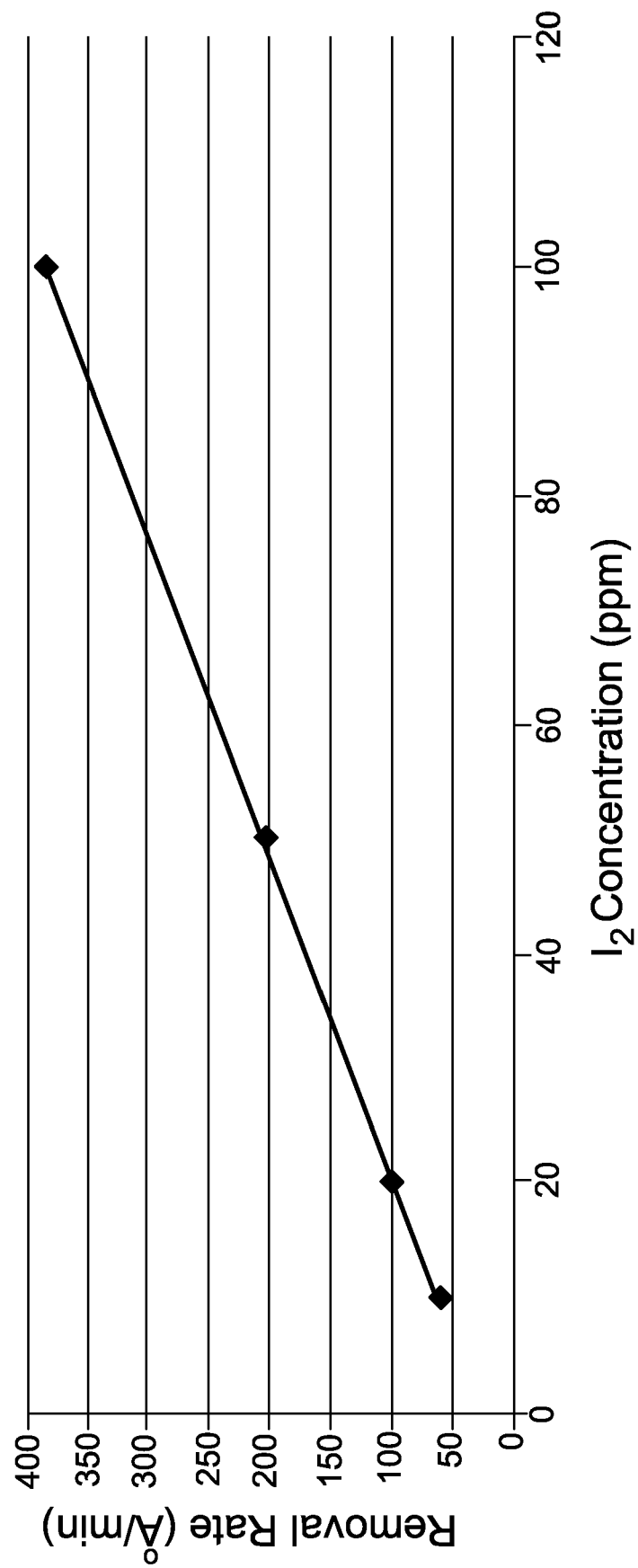

CMP SYSTEM UTILIZING HALOGEN ADDUCT

CROSS-REFERENCE TO RELATED APPLICATIONS

This patent application claims priority to copending U.S. Patent Application No. 60/841,005, filed Aug. 30, 2006.

FIELD OF THE INVENTION

This invention pertains to a chemical-mechanical polishing system and a method of polishing a substrate using the same.

BACKGROUND OF THE INVENTION

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry) for removal of material from the substrate. Polishing compositions typically are applied to a substrate by contacting the surface of the surface with a polishing pad (e.g., polishing cloth, or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

Conventional CMP compositions and methods typically are not entirely satisfactory at planarizing substrates. In particular, CMP polishing compositions and methods can result in less than desirable polishing rates and high surface defectivity when applied to a substrate. Because the performance of many substrates is directly associated with the planarity of their surfaces, it is crucial to use a CMP composition and method that results in a high polishing efficiency, selectivity, uniformity, and removal rate and leaves a high quality polish with minimal surface defects.

CMP compositions often contain oxidizing agents, which can react with the surface of the substrate, particularly a metal-containing substrate, and render the surface more susceptible to removal by mechanical abrasion. Oxidizing agents containing iodine (e.g., iodine, iodides, iodates, and periodates) are particularly useful in polishing metal-containing substrates; however, iodine is not very soluble in typical CMP compositions.

There have been attempts to improve the solubility of iodine while maintaining its beneficial characteristics as an oxidizing agent in CMP. For example, soluble iodine can be created by combining elemental iodine with compounds such as iodide, polyvinylpyrrolidone, and starch. Although these compounds can be used in CMP compositions, these compounds have drawbacks. The tri-iodide complex that is formed by the combination of iodine and iodide requires an excess of iodide and causes significant staining of the material it contacts. Polyvinylpyrrolidone and starch are large molecules and often have an undesirable impact the polishing rate of the materials being polished. Thus, there remains a need for alternative polishing compositions and methods.

BRIEF SUMMARY OF THE INVENTION

The invention provides a chemical-mechanical polishing system for polishing a substrate comprising (a) a polishing component selected from an abrasive, a polishing pad, or both an abrasive and a polishing pad, (b) an aqueous carrier, and (c) the halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.01 mM or more in the aqueous carrier.

The invention further provides a method of polishing a substrate comprising (i) providing a chemical-mechanical polishing system comprising (a) a polishing component selected from an abrasive, a polishing pad, or both an abrasive and a polishing pad, (b) an aqueous carrier, and (c) the halogen adduct resulting from the reaction of (1) an oxidizing agent selected from the group consisting of iodine, bromine, and a combination thereof and (2) a carbon acid having a pKa of about 3 to about 14, wherein the halogen adduct is present in a concentration of about 0.01 mM or more in the aqueous carrier, (ii) contacting the substrate with the polishing system, and (iii) abrading at least a portion of the surface of the substrate with the polishing system to polish the substrate.

BRIEF DESCRIPTION OF THE SEVERAL VIEWS OF THE DRAWING(S)

The FIGURE is a graph of the copper removal rate (Å/min) versus iodine concentration (ppm iodine) for a polishing system containing $I_2 \cdot (\text{malonamide})_3$.

DETAILED DESCRIPTION OF THE INVENTION

The invention provides a chemical-mechanical polishing system for polishing a substrate. The polishing system comprises (a) a polishing component selected from an abrasive, a polishing pad, or both an abrasive and a polishing pad, (b) an aqueous carrier, and (c) the halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.01 mM or more in the aqueous carrier. The carbon acids desirably enhance the performance of iodine and bromine as oxidizing agents in CMP by increasing their solubilities in the polishing system. The carbon acids also reduce undesirable reactions between iodine and/or bromine and other materials in the polishing composition and/or other materials with which the polishing composition comes into contact during polishing (e.g., the substrate being polished, as well as the polishing pad and CMP apparatus). The aqueous carrier and any other components dissolved or suspended therein, such as the abrasive, when present, and the combination of the oxidizing agent and the carbon acid, comprise the polishing composition. Concentrations of components in the polishing composition as set forth herein are based on the weight of the polishing composition, i.e., the weight of the aqueous carrier and any other components dissolved or suspended therein.

The polishing component can be any suitable polishing component. Typically, the polishing component is selected from an abrasive, a polishing pad, or both an abrasive and a polishing pad. Preferably, the polishing component comprises both an abrasive and a polishing pad. The abrasive can be fixed to the polishing pad and/or can be in particulate form and suspended in the aqueous carrier.

The abrasive can be in any suitable form (e.g., abrasive particles). The abrasive can be present in the polishing composition in any suitable amount. For example, the abrasive can be present in the polishing composition in an amount of about 0.05 wt. % or more, e.g., about 0.1 wt. % or more, or about 0.25 wt. % or more. Alternatively, or in addition, the abrasive can be present in the polishing composition in an amount of about 10 wt. % or less, e.g., about 5 wt. % or less, about 2 wt. % or less, about 1 wt. % or less, about 0.75 wt. % or less, or about 0.5 wt. % or less.

The abrasive particles can have any suitable size. The abrasive particles typically have an average particle size (e.g., average particle diameter) of about 5 nm to about 250 nm. Preferably, the abrasive particles have an average particle size of about 10 nm to about 100 inn. Most preferably, the abrasive particles have an average particle size of about 25 nm to about 80 nm. The particle size of a non-spherical particle is the diameter of the smallest sphere that encompasses the particle.

The abrasive can be any suitable abrasive, many of which are well known in the art. The abrasive desirably comprises a metal oxide. Suitable metal oxides include metal oxides selected from the group consisting of alumina, silica, titania, ceria, zirconia, germania, magnesia, co-formed products thereof, and combinations thereof. Preferably, the metal oxide is silica. The silica can be any suitable form of silica. Useful forms of silica include but are not limited to fumed silica, precipitated silica, and condensation-polymerized silica. Most preferably, the silica is condensation-polymerized silica. Condensation-polymerized silica particles typically are prepared by condensing $Si(OH)_4$ to form colloidal particles. Such abrasive particles can be prepared in accordance with U.S. Pat. No. 5,230,833 or can be obtained as any of various commercially available products, such as the Fuso PL-1 and PL-2 products, Akzo-Nobel Bindzil 50/80 product, and the Nalco 1050, 2327, and 2329 products, as well as other similar products available from DuPont, Bayer, Applied Research, Nissan Chemical, and Clariant.

The polishing pad can be any suitable polishing pad. Suitable polishing pads include, for example, woven and non-woven polishing pads, grooved and non-grooved polishing pads, porous and non-porous pads, hard and soft pads, and the like.

The polishing pad comprises a polymeric material. The polishing pad can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, conformed products thereof, and mixtures thereof. Preferably, the polishing pad comprises one or more polyurethane polymers.

The aqueous carrier can be any suitable aqueous carrier. The aqueous carrier is used to facilitate the application of the abrasive (when present and suspended in the aqueous carrier), the halogen adduct, and any other components dissolved or suspended therein to the surface of a suitable substrate to be polished (e.g., planarized). The aqueous carrier can be water alone (i.e., can consist of water), can consist essentially of water, can comprise water and a suitable water-miscible solvent, or can be an emulsion. Suitable water-miscible solvents include alcohols, such as methanol, ethanol, etc., and ethers, such as dioxane and tetrahydrofuran. Preferably, the aqueous carrier comprises, consists essentially of, or consists of water, more preferably deionized water.

It has been unexpectedly found that the carbon acid as discussed herein makes iodine and bromine very soluble in the aqueous carrier through formation of the halogen adduct without adversely impacting the polishing rate achievable by the polishing system and without causing staining of the substrate being polished with the polishing system.

The concentration of the halogen adduct in the polishing composition is about 0.01 mM or more, e.g., about 0.02 mM or more, about 0.03 mM or more, about 0.04 mM or more, about 0.05 mM or more, about 0.1 mM or more, about 0.2 mM or more, about 0.5 mM or more, about 1 mM or more, about 5 mM or more, or about 10 mM or more. The concentration of the halogen adduct in the polishing composition can be about 100 mM or less, e.g., about 80 mM or less, about 60 mM or less, about 50 mM or less, about 40 mM or less, about 30 mM or less, about 20 mM or less, about 10 mM or less, about 8 mM or less, about 5 mM or less, about 2 mM or less, or about 1 mM or less.

The oxidizing agent is selected from the group consisting of iodine, bromine, and combinations thereof. The iodine, bromine, or combination thereof can be present in the polishing composition in any suitable amount as part of the halogen adduct. The iodine, bromine, or combination thereof also can be present in the polishing composition in any suitable amount that is not part of the halogen adduct. However, the iodine, bromine, or combination thereof desirably is present in the polishing composition only or substantially only as part of the halogen adduct. For example, the concentration of iodine and/or bromine in the polishing composition, in any form (i.e., as part of the adduct and as not part of the adduct), can be about 0.01 mM or more, e.g., about 0.02 mM or more, about 0.03 mM or more, about 0.04 mM or more, about 0.05 mM or more, about 0.1 mM or more, about 0.2 mM or more, about 0.5 mM or more, about 1 mM or more, about 5 mM or more, or about 10 mM or more. The concentration of iodine and/or bromine in the polishing composition, in any form (i.e., as part of the adduct and as not part of the adduct), can be about 100 mM or less, e.g., about 80 mM or less, about 60 mM or less, about 50 mM or less, about 40 mM or less, about 30 mM or less, about 20 mM or less, about 10 mM or less, about 8 mM or less, about 5 mM or less, about 2 mM or less, or about 1 mM or less.

The iodine or bromine can be provided in the polishing composition by any suitable technique. For example, the iodine can be generated in situ from an iodide salt, an iodate salt, or a periodate salt. Similarly, the bromine can be generated in situ from a bromide salt, a bromate salt, or a perbromate salt. Accordingly, the polishing composition can comprise additional unreacted components used to make the iodine or bromine in situ, such as an iodide or bromide salt, an iodate or bromate salt, a periodate or perbromate salt, and/or other components described herein, such as other oxidizing agents and reducing agents used to provide the iodine and/or bromine.

Iodine can be generated in situ by reaction of an iodide salt with an oxidizing agent. The iodide salt can be any suitable iodide salt. For example, the iodide salt can be selected from the group consisting of potassium iodide, sodium iodide, lithium iodide, ammonium iodide, and combinations thereof. The iodate or periodate salt can be any suitable salt. For example, the iodate or periodate salt can be selected from the group consisting of sodium salts, potassium salts, ammonium salts, and the like. The oxidizing agent can be any suitable oxidizing agent having an oxidation potential sufficient to oxidize the iodide salt under the conditions of the polishing system. Suitable oxidizing agents include inorganic and organic per-compounds, chlorates, chromates, iron and copper salts (e.g., sulfates, EDTA, and citrates), rare earth and transition metal oxides (e.g., osmium tetraoxide), potassium ferricyanide, potassium dichromate, iodic acid, and the like. Examples of per-compounds include hydrogen peroxide and its adducts such as urea hydrogen peroxide and percarbonates, organic peroxides such as benzoyl peroxide, peracetic acid, and di-tert-butyl peroxide, monopersulfates, dipersulfates, and sodium peroxide. The oxidizing agent can be a compound containing an element in its highest oxidation state. Examples of compounds containing an element in its highest oxidation state include periodic acid, periodate salts, perbromic acid, perbromate salts, perchloric acid, perchlorate salts, perboric acid, perborate salts, and permanganates.

The iodine can also be generated in situ by reaction of iodic acid, periodic acid, or a salt thereof, with a reducing agent. The reducing agent can be any suitable reducing agent.

The halogen adducts are more stable than other common oxidizers and are active oxidizing agents in the polishing system without causing corrosion or planarization of the metal layer of the substrate being polished.

The carbon acid can be any suitable compound that interacts with the iodine and/or bromine to form the halogen adduct. As used herein, a carbon acid is a compound that contains a carbon molecule comprising at least one acidic proton, such that the interaction of the carbon acid and iodine and/or bromine forms a halogen adduct that is highly soluble in the polishing composition. The carbon acid can have a pKa in the range of about 3 to about 14, e.g., in the range of about 6 to about 13.

The carbon acid can have the following structure:

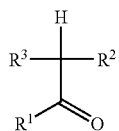

wherein $R^1$ is selected from the group consisting of OH, $R^4$, and $OR^4$, wherein $R^4$ is a substituted or unsubstituted $C_1$-$C_4$ alkyl; $R^2$ is selected from the group consisting of

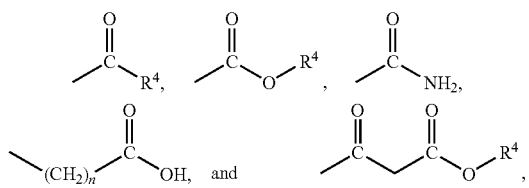

wherein n is 0 or 1; and $R^3$ is selected from the group consisting of H, $NO_2$, and a substituted or unsubstituted $C_1$-$C_6$ alkyl. In structures according to the above formula, $R^2$ includes an electron-withdrawing group, which renders the hydrogen molecule acidic. Iodine and bromine are very soluble when combined with compounds that have a carbon molecule comprising at least one acidic proton. Although not wishing to be bound by any particular theory, it is believed that the reaction between iodine and carbon acids of the invention proceeds as follows:

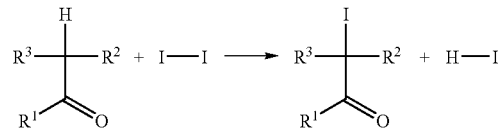

The carbon acid can have the following structure:

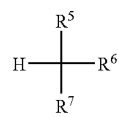

wherein $R^5$ is selected from the group consisting of $NO_2$, CN, $HSO_3$, F, Cl, Br, T, $CF_3$, $CO_2CF_3$, $CO_2CH_2CF_3$, $CO_2CH(CF_3)_2$, $SO_2CF_3$, and $SO_2R^8$, wherein $R^8$ is a substituted or unsubstituted $C_1$-$C_4$ alkyl; and $R^6$ and $R^7$ are independently selected from the group consisting of H, $R^5$, and substituted or unsubstituted $C_1$-$C_4$ alkyls; or $R^6$ and $R^7$ are joined together to form a 4-8 membered ring.

The carbon acid can be selected from the group consisting of acetyl acetone, ethylacetoacetate, dimethyl malonate, malonamide, malonic acid, methyl malonate monoamide, diethyl nitromalonate, phenyl malonic acid, 1,3-acetonedicarboxylic acid, aceto acetamide, and dimethyl methylmalonate. The carbon acid can be an ester, Preferred esters are methyl and ethyl esters. Preferably, the carbon acid is not a carboxylic acid.

The carbon acid can be present in the polishing composition in any suitable amount, desirably only or substantially only as part of the halogen adduct, though it can be desirable to have an amount of the carbon acid that is in excess of the stoichiometric amount needed to form the halogen adduct in order to ensure that substantially all of the iodine and/or bromine is present in the form of the halogen adduct. For example, the carbon acid can be present in the polishing composition in any form (i.e., as part of the adduct and as not part of the adduct), in a concentration of about 0.01 mM or more, e.g., about 0.015 mM or more, about 0.02 mM or more, about 0.03 mM or more, about 0.05 mM or more, about 0.09 mM or more, or about 0.1 mM or more. Alternatively, or in addition, the carbon acid can be present in the polishing composition in any form (i.e., as part of the adduct and as not part of the adduct), in a concentration of about 720 mM or less, e.g., about 400 mM or less, about 240 mM or less, about 160 mM or less, about 120 mM or less, about 80 mM or less, about 60 mM or less, about 40 mM or less, about 20 mM or less, or about 10 mM or less. The carbon acid can be provided in a stoichiometric amount relative to the concentration of the iodine and/or bromine to form the halogen adduct. For example, the iodine ($I_2$) and/or bromine ($Br_2$) and the carbon acid can be provided in a 1:1 molar ratio, e.g., a 1:1.5 molar ratio, a 1:2 molar ratio, a 1:3 molar ratio, a 1:5 molar ratio, or a 1:9 molar ratio. Alternatively, the carbon acid can be provided in an excess amount (e.g., 50% or more in excess, 100% or more in excess, 200% or more in excess, 300% or more in excess, 500% or more in excess, 900% or more in excess) relative to the amount of iodine and/or bromine with which it will interact. Desirably, the carbon acid and the iodine and/or bromine interact in the absence of any other components of the polishing composition. The carbon acid and the iodine and/or bromine also can react in the presence of additional components of the polishing composition.

The polishing composition can have any suitable pH. For example, the polishing composition can have a pH of about 1 to about 6 (e.g., a pH of 2, a pH of 3, a pH of 4, or a pH of 5). Typically, the polishing system has a pH of about 2 or greater. The pH of the polishing composition typically is about 4 or less.

The pH of the polishing composition can be achieved and/or maintained by any suitable means. More specifically, the polishing composition can further comprise a pH adjustor, a pH buffering agent, or a combination thereof. The pH adjustor can be any suitable pH-adjusting compound. For example, the pH adjustor can be an acid. The acid can be any suitable acid. Typically, the acid is acetic acid, nitric acid, phosphoric acid, oxalic acid, and combinations thereof. Preferably, the acid is nitric acid. The ph adjustor can alternatively be a base, The base can be any suitable base. Typically, the base is potassium hydroxide, ammonium hydroxide, and combinations thereof. Preferably, the base is ammonium hydroxide. The pH buffering agent can be any suitable buffering agent. For example, the pH buffering agent can be a phosphate, sulfate, acetate, borate, ammonium salt, and the lice. The polishing composition can comprise any suitable amount of a pH adjustor and/or a pH buffering agent, provided that a suitable amount is used to achieve and/or maintain the pH of the polishing composition within the pH ranges set forth herein.

The polishing composition optionally further comprises one or more additional oxidizing agents (e.g., a second oxidizing agent, a third oxidizing agent, etc.). The additional oxidizing agent(s) can be any suitable organic or inorganic oxidizing agent(s). Preferably, the second oxidizing agent is an organic oxidizing agent, while the third oxidizing agent preferably is either an organic or inorganic oxidizing agent.

Examples of organic oxidizing agents include quinones, including, without limitation, anthraquinones with one or more functional groups. The functional groups primarily aid in enhancing the solubility of the anthraquinone. The anthraquinones can comprise a mixture of functional groups. Preferably, the functional groups include, without limitation, sulfonates, phosphates, and amines. More preferably, the functional groups include sulfonic acids. For example, 9,10-anthraquinone-1,8-disulfonic acid, 9,10-anthraquinone-1,5-disulfonic acid, and 9,10-anthraquinone-2,6-disulfonic acid (AQDSA).

Examples of additional oxidizing agents suitable for this invention include hydrogen peroxide, peroxymonosulfate salts (e.g., potassium peroxymonosulfate), persulfate salts (e.g., ammonium monopersulfate, ammonium dipersulfate, potassium monopersulfate, and potassium dipersulfate), periodate salts, (e.g., potassium periodate), perchlorate salts (e.g., potassium perchlorate), iodate salts (e.g., potassium iodate), permanganate salts (e.g., potassium permanganate), bromate salts (e.g., potassium bromate), and n-methylmorpholine-N-oxide.

The polishing composition optionally further comprises a corrosion inhibitor (i.e., a film-forming agent). The corrosion inhibitor can be any suitable corrosion inhibitor for any component(s) of the substrate. Preferably, the corrosion inhibitor is a copper-corrosion inhibitor. For the purposes of this invention, a corrosion inhibitor is any compound, or mixture of compounds, that facilitates the formation of a passivation layer (i.e., a dissolution-inhibiting layer) on at least a portion of the surface being polished. The polishing composition can comprise any suitable amount of the corrosion inhibitor. Generally, the polishing composition comprises about 0.005 wt. % to about 1 wt. % (e.g., about 0.01 to about 0.5 wt. %, or about 0.02 to about 0.2 wt. %) of the corrosion inhibitor.

The polishing composition optionally further comprises one or more other additives. The polishing composition can comprise a surfactant and/or rheological control agent, including viscosity enhancing agents and coagulants (e.g., polymeric rheological control agents, such as, for example, urethane polymers). Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., oxidizing agent, abrasive, etc.) as well as any combination of ingredients (e.g., source of iodine, surfactants, etc.).

The invention also provides a method of polishing a substrate with the polishing system described herein. The method of polishing a substrate comprises (i) providing the aforementioned chemical-mechanical polishing system, (ii) contacting the substrate with the polishing system, and (iii) abrading at least a portion of the surface of the substrate with the polishing system to polish the substrate.

In particular, the invention further provides a method of chemically-mechanically polishing a substrate comprising providing a chemical-mechanical polishing system comprising (a) a polishing component selected from an abrasive, a polishing pad, or both an abrasive and a polishing pad, (b) an aqueous carrier, and (c) the halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.01 mM or more in the aqueous carrier, (ii) contacting the substrate with the polishing system, and (iii) abrading at least a portion of the surface of the substrate with the polishing system to polish the substrate.

The polishing system of the invention is useful for polishing any substrate. Desirably, the polishing system is particularly useful in the polishing of a substrate comprising at least one metal layer comprising Cu, Ta, TaN, Ti, TiN, noble metals, alloys thereof, and combinations thereof. The substrate can be any suitable substrate (e.g., an integrated circuit, metals, ILD layers, semiconductors, and thin films) and can further comprise any suitable insulating layer and/or other metal or metal alloy layer (e.g., metal conductive layer). The insulating layer can be a metal oxide, glass, organic polymer, fluorinated organic polymer, or any other suitable high or low-k insulating layer. The insulating layer preferably is a silicon-based metal oxide. The additional metal or metal alloy layer can be any suitable metal or metal alloy layer.

In accordance with the invention, a substrate can be planarized or polished with the polishing system described herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing system of the invention and then abrading at least a portion of the surface of the substrate with the polishing system to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e., the determination of when to terminate the polishing process with respect to a particular workpiece.

EXAMPLES

The following examples further illustrate the invention but, of course, should not be construed as in any way limiting its scope.

In each of the following examples, an iodine adduct was prepared by adding 0.5 g $I_2$ and 5 molar equivalents of the carbon acid to 100 g of deionized water. The theoretical maximum concentration of the halogen adduct in the polishing composition was 5000 ppm.

Example 1

This example demonstrates the formation of iodine adducts according to the invention. Iodine adducts were prepared as detailed above. Iodine adducts were prepared with seven different carbon acids (Polishing Systems 1A-1G). The 5000 ppm $I_2$ sample was diluted 50 times to make solutions that were 100 ppm $I_2$. The reaction between $I_2$ and the carbon acids of the invention is as follows: carbon acid+$I_2$→carbon acid-I+HI. As is well known in the art, iodine is in rapid equilibrium with tri-iodide ($I_3^-$). See, e.g., Ronald O. Rahn, Analytica Chimica Acta 248, 595-602 (1991). Tri-iodide exhibits an absorbance peak at 350 nm, as measured by UV-Vis spectroscopy. Therefore, any iodine that has not formed an iodine adduct will be in equilibrium with tri-iodide and will be evidenced by a UV-Vis absorbance peak at 350 nm.

To determine the extent of formation of iodine adducts according to the invention, UV-vis spectra were taken on an Agilent 8453 UV-Vis Spectrophotometer. $KI_3$ was used to establish a calibration curve for tri-iodide. The results of the UV-Vis spectra are set forth below in Table 1.

TABLE 1

Extent of Iodine Adduct Formation as a Function of Iodine Concentration After Combination of Iodine and Carbon Acid

| Polishing System | Iodine Adduct | Absorbance | ppm $I_3$ |
|---|---|---|---|
| 1A (comparative) | $KI_3$ | >1 | 100 |
| 1B (invention) | $I_2$ * (Malonic Acid)$_5$ | 0 | 0 |
| 1C (invention) | $I_2$ * (Acetylacetone)$_5$ | 0 | 0 |
| 1D (invention) | $I_2$ * (Ethylacetoacetate)$_5$ | 0 | 0 |
| 1E (invention) | $I_2$ * (Dimethyl malonate)$_5$ | 0.2369 | 3.7 |
| 1F (invention) | $I_2$ * (1,3-acetone dicarboxylic acid)$_5$ | 0 | 0 |
| 1G (invention) | $I_2$ * (Malonamide)$_5$ | 0.2272 | 3.6 |

These results demonstrate that iodine, when added to a carbon acid of the invention, forms a halogen adduct that leaves very little, if any, iodine left undissolved in solution. The intensity of the absorbance peak of $KI_3$ is greater than 1, indicating that the detector is saturated and virtually all of the iodine is in the form of tri-iodide. The intensity of the tri-iodide absorbance peak for the halogen adducts is about 0.5 or less, e.g., about 0.4 or less, about 0.3 or less, about 0.2 or less, about 0.1 or less, or undetectable. The low (or nonexistent) absorbance peak indicates that almost all, if not all, of the iodine reacts with the carbon acids of the invention to form a halogen adduct.

Example 2

This example demonstrates the effect of the carbon acids on the solubility of iodine.

Iodine adducts were prepared with seventeen different carbon acids and included in sixteen different polishing systems (Polishing Systems 2A-2P). The iodine adducts were prepared as detailed above. Specifically, the iodine adducts were prepared in a glass container covered with two layers of parafilm, and were placed on a stir-plate and allowed to mix for several days. Upon removal from the stir-plate, any undissolved $I_2$ was separated under vacuum.

Any undissolved $I_2$ crystals were transferred to weighing paper and their mass determined to calculate the amount of any $I_2$ that did not form the iodine adduct. Where applicable, and with one exception noted below, the pKa of the proton of interest on the carbon acid was calculated using the commercially available program ACD/pKa from ACD Labs. The solubility of each of the iodine adducts is set forth below in Table 2.

TABLE 2

Solubility of Iodine as a Function of the Structure and/or pKa of the Carbon Acid

| Polishing System | Carbon Acid | CAS# | pKa | ppm $I_2$ Solubility |
|---|---|---|---|---|
| 2A | Acetyl acetone (invention) | 123-54-6 | 8.940 | >5000 |
| 2B | Ethyl acetoacetate (invention) | 141-97-9 | 11.82 | >5000 |
| 2C | Dimethyl malonate (invention) | 108-59-8 | 11.8 | >5000 |
| 2D | Malonic acid (invention) | 141-82-2 | — | >5000 |
| 2E | Methyl malonate monoamide (invention) | 51513-29-2 | — | >5000 |
| 2F | Diethyl nitromalonate (invention) | 603-67-8 | 6.459 | >5000 |
| 2G | Phenyl malonic acid (invention) | 2613-89-0 | 11.79 | >5000 |
| 2H | 1,3-acetonedicarboxylic acid (invention) | 542-05-2 | 9.36 | >5000 |
| 2I | Aceto acetamide (invention) | 5977-14-0 | 12.38 | >5000 |
| 2J | Dimethyl methylmalonate (invention) | 609-02-9 | 13.08 | 1750 |
| 2K | Nitromethane (invention) | 75-52-5 | 11 | >5000 |
| 2L | Succinamide (comparative) | 110-14-5 | >16 | 500 |
| 2M | Glucuronamide (comparative) | 3789-97-7 | — | 1200 |
| 2N | Salicyladoxime (comparative) | 94-67-7 | — | — |
| 2O | Biuret (comparative) | 108-19-0 | — | 600 |

TABLE 2-continued

Solubility of Iodine as a Function of the Structure and/or pKa of the Carbon Acid

| Polishing System | Carbon Acid | CAS# | pKa | ppm $I_2$ Solubility |
|---|---|---|---|---|
| 2P | Guanidine hydrochloride (comparative) | 50-01-1 | — | 800 |

These results demonstrate that the structure (and resulting pKa) of the carbon acid has a large impact on the solubility of iodine in the polishing composition. As illustrated by the table above, carbon acids having a pKa in the range of about 3 to about 14 form very soluble halogen adducts with iodine according to the invention. The pKa of some of the carbon acids could not be calculated, as indicated by the dash in Table 2 above. Further, the pKa of nitromethane is according Thomas Lowry and Kathleen S. Richardson, "Mechanism and Theory in Organic Chemistry," p. 307, 3d. ed. (1987). Although iodine completely dissolves when combined with diethyl nitromalonate, it should be noted that iodine chips appear to react and form a dark oil that is insoluble in the water.

Example 3

This example demonstrates the effectiveness of iodine adducts on the removal rate of copper with the polishing system of the invention.

Copper wafers were polished with different polishing systems using a conventional CMP apparatus. The wafers were polished with six different polishing systems (Polishing Systems 3A-3F), each polishing system including one of six different iodine adducts.

Polishing systems were prepared by combination of 4 wt. % colloidal silica (approximately 50 nm in diameter), iodine adduct (prepared as detailed above), and nitric acid to adjust the pH to 2.8. The polishing parameters were as follows: 20.3 kPa (2.95 psi) to 21.0 kPa (3.05 psi) down force pressure, 110 rpm platen speed, 102 rpm carrier speed, and 100 ml/min polishing composition flow. The pad was conditioned with Dimonex conditioner. Following polishing, the removal rate of copper from the blanket wafers was determined in Å/min. The results are summarized in Table 3.

TABLE 3

Copper Removal Rates as a Function of Iodine Adduct Used

| Polishing System | Iodine Adduct | Average Copper Polishing Rate (Å/min) |
|---|---|---|
| 3A (comparative) | $I_2$ * (Potassium Iodate)$_5$ | 257 |
| 3B (invention) | $I_2$ * (Malonic Acid)$_5$ | 134 |
| 3C (invention) | $I_2$ * (Acetylacetone)$_5$ | 193 |
| 3D (invention) | $I_2$ * (Ethylacetoacetate)$_5$ | 244 |
| 3E (invention) | $I_2$ * (Malonamide)$_5$ | 160 |
| 3F (invention) | $I_2$ * (Dimethyl Malonate)$_5$ | 243 |

These results demonstrate that the iodine adducts according to the present invention are very active for oxidizing metals in the CMP process.

Example 4

This example demonstrates the effectiveness of the combination of iodine adducts with a second oxidizing agent on the removal rates of copper, tantalum, and TiN.

Copper, tantalum, and TiN wafers were polished with different polishing systems using a conventional CMP apparatus. The wafers were polished with nine different polishing systems (Polishing Systems 4A-4I).

Polishing systems were prepared by combination of 4 wt. % colloidal silica (approximately 50 nm in diameter), 500 ppm benzotriazole (BTA), and nitric acid or ammonium hydroxide to adjust the pH to 2.8. Polishing Systems 4A-4H contained iodine-malonamide adduct. Polishing Systems 4B-4E, 4G and 4H also included a second oxidizing agent. Polishing System 4I did not contain an oxidizing agent. The substrates were polished on a Logitech tabletop polisher with an EPIC™ D100 pad (Cabot Microelectronics, Aurora, Ill.). The polishing parameters were as follows: 10.32 kPa (1.5 psi) down force, 102 rpm platen speed, 110 rpm carrier speed, and 100 mL/min polishing composition flow. The pad was conditioned with Dimonex conditioner. Following polishing, the removal rates of copper, tantalum, and TiN from the blanket wafers were determined in Å/min. The results are summarized in Table 4.

TABLE 4

Material Removal Rates as a Function of the Combination of Iodine-Malonamide Adduct with a Second Oxidizing Agent

| Polishing System | Conc. of Iodine-Malonamide Adduct (mM) | Second Oxidizing Agent | Conc. of Second Oxidizing Agent (mM) | Average Cu Polishing Rate (Å/min) | Average TiN Polishing Rate (Å/min) | Average Ta Polishing Rate (Å/min) |
|---|---|---|---|---|---|---|
| 4A (invention) | 0.9 | none | none | 256 | 287 | 836 |
| 4B (invention) | 0.9 | AQDSA | 5.4 | 467 | 128 | 1285 |
| 4C (invention) | 0.9 | Persulfate | 1.85 | 622 | 707 | 493 |
| 4D (invention) | 0.9 | $H_2O_2$ | 1.85 | 666 | 1066 | 12 |

TABLE 4-continued

Material Removal Rates as a Function of the Combination of Iodine-Malonamide Adduct with a Second Oxidizing Agent

| Polishing System | Conc. of Iodine-Malonamide Adduct (mM) | Second Oxidizing Agent | Conc. of Second Oxidizing Agent (mM) | Average Cu Polishing Rate (Å/min) | Average TiN Polishing Rate (Å/min) | Average Ta Polishing Rate (Å/min) |
|---|---|---|---|---|---|---|
| 4E (invention) | 0.9 | Iodate | 1.85 | 849 | 828 | 559 |
| 4F (invention) | 1.85 | none | none | 464 | 266 | 450 |
| 4G (invention) | 1.85 | AQDSA | 5.4 | 853 | 161 | 500 |
| 4H (invention) | 1.85 | $H_2O_2$ | 1.85 | 462 | 6 | 6 |
| 4I (comparative) | none | none | none | 16 | 89 | 6 |

These results demonstrate that the effectiveness of iodine adducts as oxidizing agents in CMP is further enhanced by the addition of a second oxidizing agent to the polishing system. By carefully choosing specific concentrations of the iodine-malonamide adduct and a second or third oxidizing agent to include in the polishing system (if any additional oxidizing agent is included at all), the desired polishing rates for Cu, Ta, and TiN can be selected and tuned. For example, while the addition of AQDSA, as in Polishing System 4G, increases the polishing rates of Cu and Ta, it decreases the polishing rate of TiN from that obtained by using the iodine adduct alone (as in Polishing System 4F). Similarly, while the inclusion of a greater amount of iodine-malonamide adduct increases the polishing rate of copper, it decreases the polishing rate of Ta (compare Polishing Systems 4A and 4F).

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing system for polishing a substrate comprising:
    (a) a polishing component selected from an abrasive, a polishing pad, or both an abrasive and a polishing pad,
    (b) an aqueous carrier, and
    (c) a halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.001 mM or more in the aqueous carrier, and wherein the carbon acid has the following structure:

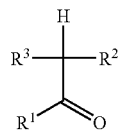

wherein $R^1$ is selected from the group consisting of OH, $R^4$, and $OR^4$, wherein $R^4$ is a substituted or unsubstituted $C_1$-$C_4$ alkyl; $R^2$ is selected from the group consisting of

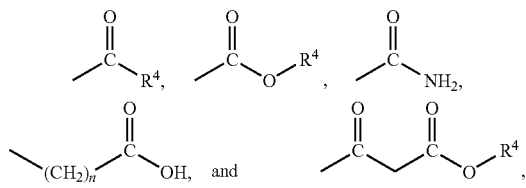

wherein n is 0 or 1; and $R^3$ is selected from the group consisting of H, $NO_2$, and a substituted or unsubstituted $C_1$-$C_6$ alkyl.

2. The polishing system of claim 1, wherein the oxidizing agent is iodine, and wherein the halogen adduct is present in a concentration of about 0.001 mM to about 30 mM in the aqueous carrier.

3. The polishing system of claim 2, wherein the halogen adduct is present in a concentration of about 0.004 mM to about 8 mM in the aqueous carrier.

4. The polishing system of claim 1, wherein the polishing system further comprises a second oxidizing agent, wherein the second oxidizing agent comprises a quinone moiety.

5. The polishing system of claim 1, wherein the polishing system further comprises a second oxidizing agent selected from the group consisting of hydrogen peroxide, potassium peroxymonosulfate, persulfate salts, periodate salts, perchlorate salts, iodate salts, potassium permanganate, bromate salts, chlorate salts, and n-methylmorpholine-N-oxide.

6. The polishing system of claim 1, wherein the carbon acid has a pKa of about 6 to about 13.

7. The polishing system of claim 1, wherein $R^2$ is

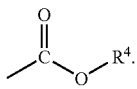

8. A chemical-mechanical polishing system for polishing a substrate comprising:

(a) a polishing component selected from an abrasive, a polishing pad, or both an abrasive and a polishing pad, (b) an aqueous carrier, and (c) a halogen adduct resulting from the reaction of (1) an oxidizing agent selected from the group consisting of iodine, bromine, and a combination thereof, and (2) a carbon acid having a pKa of about 3 to about 14, wherein the halogen adduct is present in a concentration of about 0.001 mM or more in the aqueous carrier, wherein the carbon acid has the following structure:

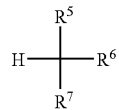

wherein $R^5$ is selected from the group consisting of $NO_2$, CN, $HSO_3$, F, Cl, Br, I, $CF_3$, $CO_2CF_3$, $CO_2CH_2CF_3$, $CO_2CH(CF_3)_2$, $SO_2CF_3$, and $SO_2R^8$, wherein $R^8$ is a substituted or unsubstituted $C_1$-$C_4$ alkyl; and $R^6$ and $R^7$ are independently selected from the group consisting of H, $R^5$, and substituted or unsubstituted $C_1$-$C_4$ alkyls; or $R^6$ and $R^7$ are joined together to form a 4-8 membered ring.

9. The polishing system of claim 1, wherein the carbon acid is selected from the group consisting of acetyl acetone, ethylacetoacetate, dimethyl malonate, malonamide, malonic acid, methyl malonate monoamide, diethyl nitromalonate, phenyl malonic acid, 1,3-acetonedicarboxylic acid, aceto acetamide, dimethyl methylmalonate, and nitromethane.

10. The polishing system of claim 1, wherein the polishing component comprises an abrasive suspended in the aqueous carrier, and wherein the abrasive is a metal oxide selected from the group consisting of alumina, silica, ceria, zirconia, titania, germania, and combinations thereof.

11. The polishing system of claim 10, wherein the metal oxide abrasive is silica.

12. The polishing system of claim 1, wherein the polishing component comprises an abrasive, and wherein the abrasive is fixed to the polishing pad.

13. The polishing system of claim 1, wherein the polishing system further comprises an acid.

14. The polishing system of claim 13, wherein the acid is selected from the group consisting of acetic acid, nitric acid, phosphoric acid, oxalic acid, and combinations thereof.

15. The polishing system of claim 13, wherein the acid is present in an amount sufficient to adjust the pH of the aqueous carrier and any other components dissolved or suspended therein to a range of about 2 to about 6.

16. The polishing system of claim 15, wherein the acid is present in an amount sufficient to adjust the pH of the aqueous carrier and any other components dissolved or suspended therein to a range of about 2 to about 3.

* * * * *